United States Patent
Ichino

(10) Patent No.: US 6,714,146 B2
(45) Date of Patent: Mar. 30, 2004

(54) CODE CONVERTER AND METHOD OF CODE CONVERSION

(75) Inventor: Kiyohisa Ichino, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/299,906

(22) Filed: Nov. 20, 2002

(65) Prior Publication Data

US 2003/0095054 A1 May 22, 2003

(30) Foreign Application Priority Data

Nov. 21, 2001 (JP) .................................. 2001-355449

(51) Int. Cl.[7] ................................................ H03M 7/00
(52) U.S. Cl. ........................................ 341/50; 341/51
(58) Field of Search .................... 341/50, 51; 370/416; 345/169

(56) References Cited

U.S. PATENT DOCUMENTS 5,255,265 A * 10/1993 Eng et al. ................... 370/416
5,473,346 A * 12/1995 Pollack ....................... 345/169

* cited by examiner

Primary Examiner—Jean Jeanglaude
(74) Attorney, Agent, or Firm—Dickstein, Shapiro, Morin & Oshinsky, LLP.

(57) ABSTRACT

A sequence of randomly arriving input codes of first type (control) are stored in first sequential storage locations in order of arrival and the input codes of second type (data) are stored in second sequential storage locations in order of arrival, and order-of-arrival indications of the input codes are stored in third sequential storage locations. The contents of all storage locations are organized into a predetermined format using a signal indicating whether the input code is of the first or second type. The organized format contains an identification code indicating whether or not it is a mixture of the first and second types of input codes. Preferably, a counter is provided for producing a count number of input codes of the first type, which is used to produce data to be appended to the organized format when a predetermined number of input codes are received.

26 Claims, 12 Drawing Sheets

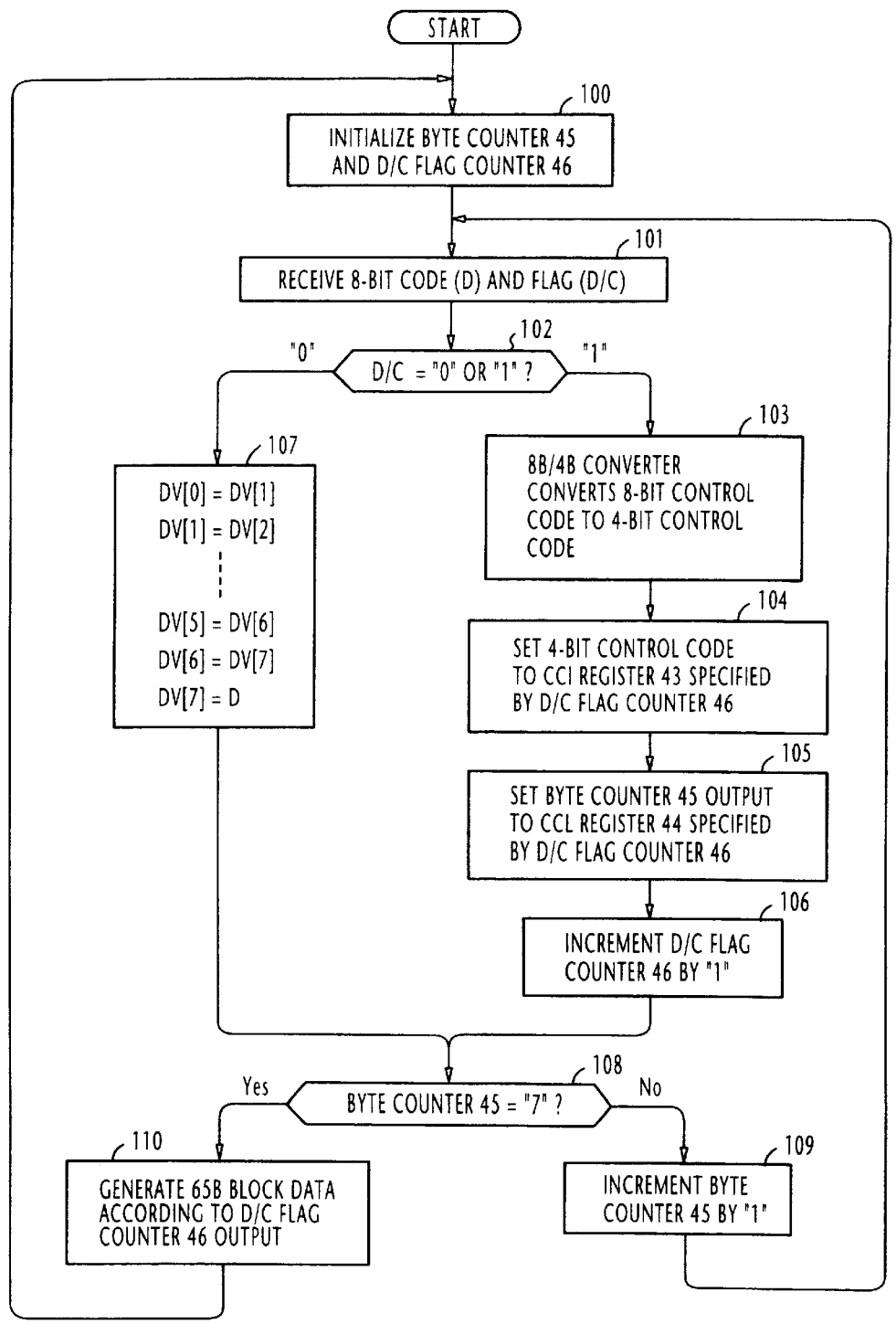

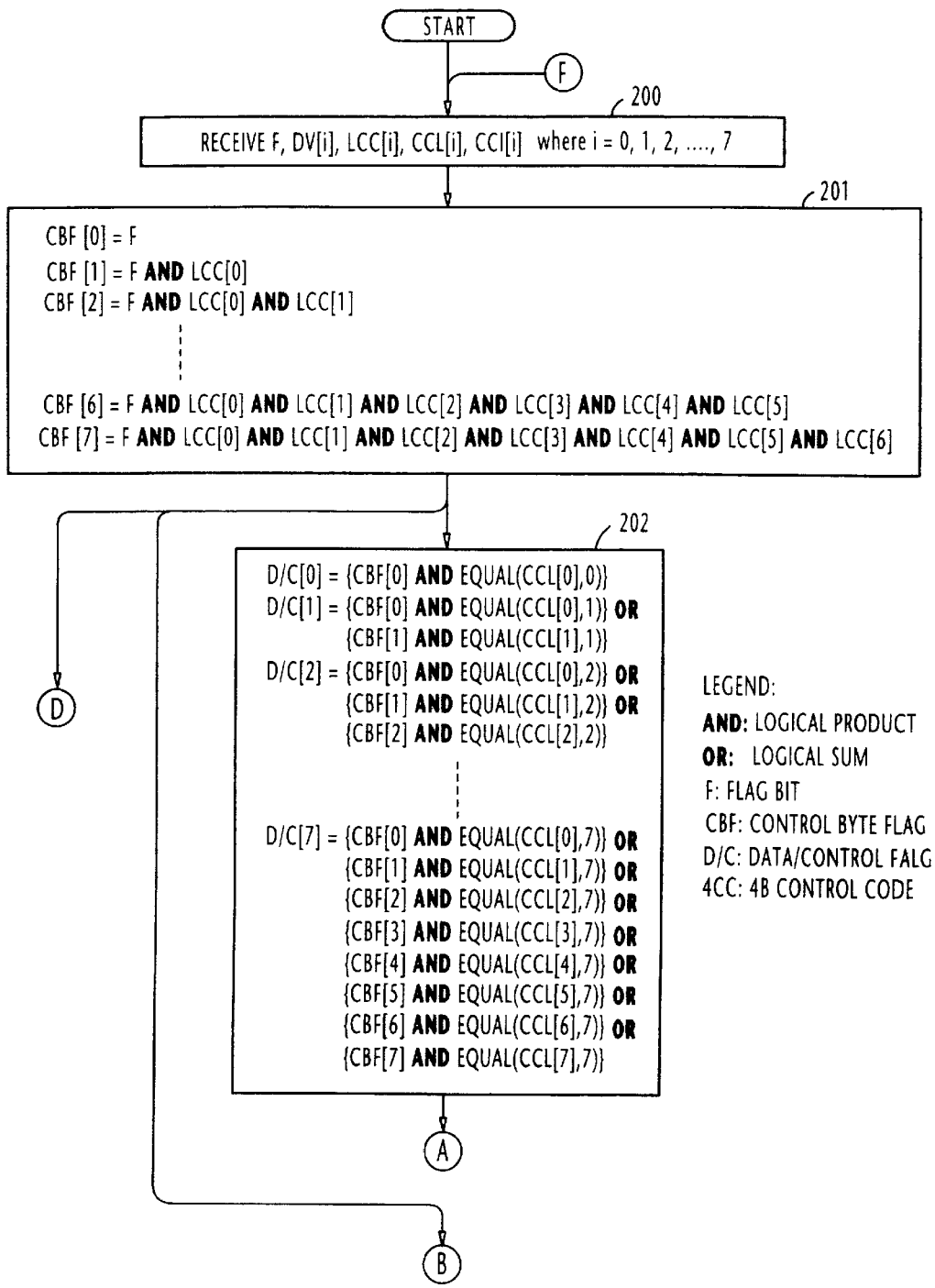

FIG. 7

| NO. OF CONTROL CODES | 1ST BYTE | 2ND BYTE | 3RD BYTE | 4TH BYTE | 5TH BYTE | 6TH BYTE | 7TH BYTE | 8TH BYTE |
|---|---|---|---|---|---|---|---|---|
| 0 | 0 DV[0] | DV[1] | DV[2] | DV[3] | DV[4] | DV[5] | DV[6] | DV[7] |
| 1 | 1 0 CCL[0] | DV[1] | DV[2] | DV[3] | DV[4] | DV[5] | DV[6] | DV[7] |
| 2 | 1 1 CCL[0] | 0 CCL[1] | DV[2] | DV[3] | DV[4] | DV[5] | DV[6] | DV[7] |
| 3 | 1 1 CCL[0] | 1 CCL[1] | 0 CCL[2] | DV[3] | DV[4] | DV[5] | DV[6] | DV[7] |
| 4 | 1 1 CCL[0] | 1 CCL[1] | 1 CCL[2] | 0 CCL[3] | DV[4] | DV[5] | DV[6] | DV[7] |
| 5 | 1 1 CCL[0] | 1 CCL[1] | 1 CCL[2] | 1 CCL[3] | 0 CCL[4] | DV[5] | DV[6] | DV[7] |
| 6 | 1 1 CCL[0] | 1 CCL[1] | 1 CCL[2] | 1 CCL[3] | 1 CCL[4] | 0 CCL[5] | DV[6] | DV[7] |
| 7 | 1 1 CCL[0] | 1 CCL[1] | 1 CCL[2] | 1 CCL[3] | 1 CCL[4] | 1 CCL[5] | 0 CCL[6] | DV[7] |
| 8 | 1 1 CCL[0] | 1 CCL[1] | 1 CCL[2] | 1 CCL[3] | 1 CCL[4] | 1 CCL[5] | 1 CCL[6] | 0 CCL[7] |
| | F LCC[0] | LCC[1] | LCC[2] | LCC[3] | LCC[4] | LCC[5] | LCC[6] | LCC[7] |

FIG. 9

| 8-BIT CONTROL CODE | 4-BIT CONTROL CODE | MEANING |
|---|---|---|
| 00011100 | 0000 | K28.0 |
| 00111100 | 0001 | K28.1 |
| 01011100 | 0010 | K28.2 |
| 01111100 | 0011 | K28.3 |
| 10011100 | 0100 | K28.4 |
| 10111100 | 0101 | K28.5 |
| 11011100 | 0110 | K28.6 |
| 11111100 | 0111 | K28.7 |
| 11110111 | 1000 | K23.7 |
| 11111011 | 1001 | K27.7 |
| 11111101 | 1010 | K29.7 |
| 11111110 | 1011 | K30.7 |

CODE CONVERTER AND METHOD OF CODE CONVERSION

BACKGROUND OF THE INVENTION

1. Field of the Invention

The present invention relates generally to the conversion of an input sequence of randomly arriving codes of first or second type or a mixture thereof into an output sequence of predetermined format, and more specifically to conversion of a series of eight decoded 8B/10B codes (i.e., 64B) to a 65B block and inverse conversion of the 65B block to a sequence of eight eight-bit codes.

2. Description of the Related Art

According to the GFP (Generic framing Procedure) draft standard currently under study by the ANSI T1X1.5, frames such as Ethernet and PPP protocol are encapsulated in a frame of higher or lower layer for transmission over SONET/SDH transport networks. The GFP standard also defines a format for encapsulating stream data of 8B/10B block codes into a frame. The 8B/10B block code is extensively used in a number of protocols such as Gigabit Ether, fiber channels and DVD-ASI standard. When encapsulating a 8B/10B code in a GFP frame, eight 8B/10B codes are converted to a data block of 65 bits and this conversion process is known as a 64B/65B conversion.

However, the computation involved in the current 64B/65B conversion process and 65B/64B conversion process (inverse conversion of 64B/65B conversion) are considerably complex and requires a substantial amount of hardware.

SUMMARY OF THE INVENTION

It is therefore an object of the present invention to provide a code converter and a method of code conversion that eliminate redundant computations involved with the prior art conversion processes by utilizing the inherent property of the protocol, i.e., code sequence integrity.

According to a first aspect of the present invention, there is provided a code converter for receiving a sequence of randomly arriving input codes of first and second types, comprising storage circuitry for storing the input codes of the first type in first sequential positions in order of arrival, storing the input codes of the second type in second sequential positions in order of arrival, and storing order-of-arrival indications of the input codes in third sequential positions, and control circuitry connected to the storage circuitry for organizing contents of the first, second and third sequential positions into a predetermined format according to a signal indicating whether the input code is of the first type or the second type, the organized format containing an identification code indicating whether or not the organized format is a mixture of the first and second types of input codes. Preferably, the control circuitry comprises a first counter for producing a first count value indicating a count number of input codes of the first type, and a second counter for sequentially producing a second count value indicating an order of arrival of each of the input codes in the sequence of random arrival. The formatting circuitry organizes contents of the first, second and third sequential positions into the predetermined format according to the first count value when the second count value attains a predetermined value.

According to a second aspect, the present invention provides an inverse code converter for receiving a sequence of input codes of first and second types, the input codes of the firs type being consecutively arranged in the sequence and the input codes of the second type being consecutively arranged in the sequence, the sequence containing an identification code indicating whether or not the sequence Is a mixture of the first and second types of input codes and position indications of the input codes of the first type in the sequence. The inverse converter comprises first detector circuitry for detecting the input codes of the first type according to the identification code and producing a count number of the input codes of the first type, first reordering circuitry for reordering the input codes of the first type according to the position indications and the count number, second detector circuitry for producing a type-indication signal indicating whether each of the input codes is of the first type or the second type based on the position indications and the count number, position detector circuitry for determining the position of each input code of the second type in an output sequence according to the type-indication signal, second reordering circuitry for reordering each of the input codes of the second type according to the position determined by the position detector circuitry, and selector circuitry for selecting one of the reordered input code of the first type and the reordered input code of the second type according to the type-indication signal.

BRIEF DESCRIPTION OF THE DRAWINGS

The present invention will be described in detail further with reference to the following drawings, in which:

FIG. 2 is a flowchart of the operation of the converter of FIG. 1;

FIGS. 4A, 4B and 4C are flowcharts of the operation of the converter of FIGS. 3A and 3B;

FIG. 7 is an illustration of the data structure of a 65B data block;

FIG. 9 is an illustration of a conversion table for mapping one-to-one relationships between 8-bit control codes an corresponding 4-bit control codes.

DETAILED DESCRIPTION

Figure 1:
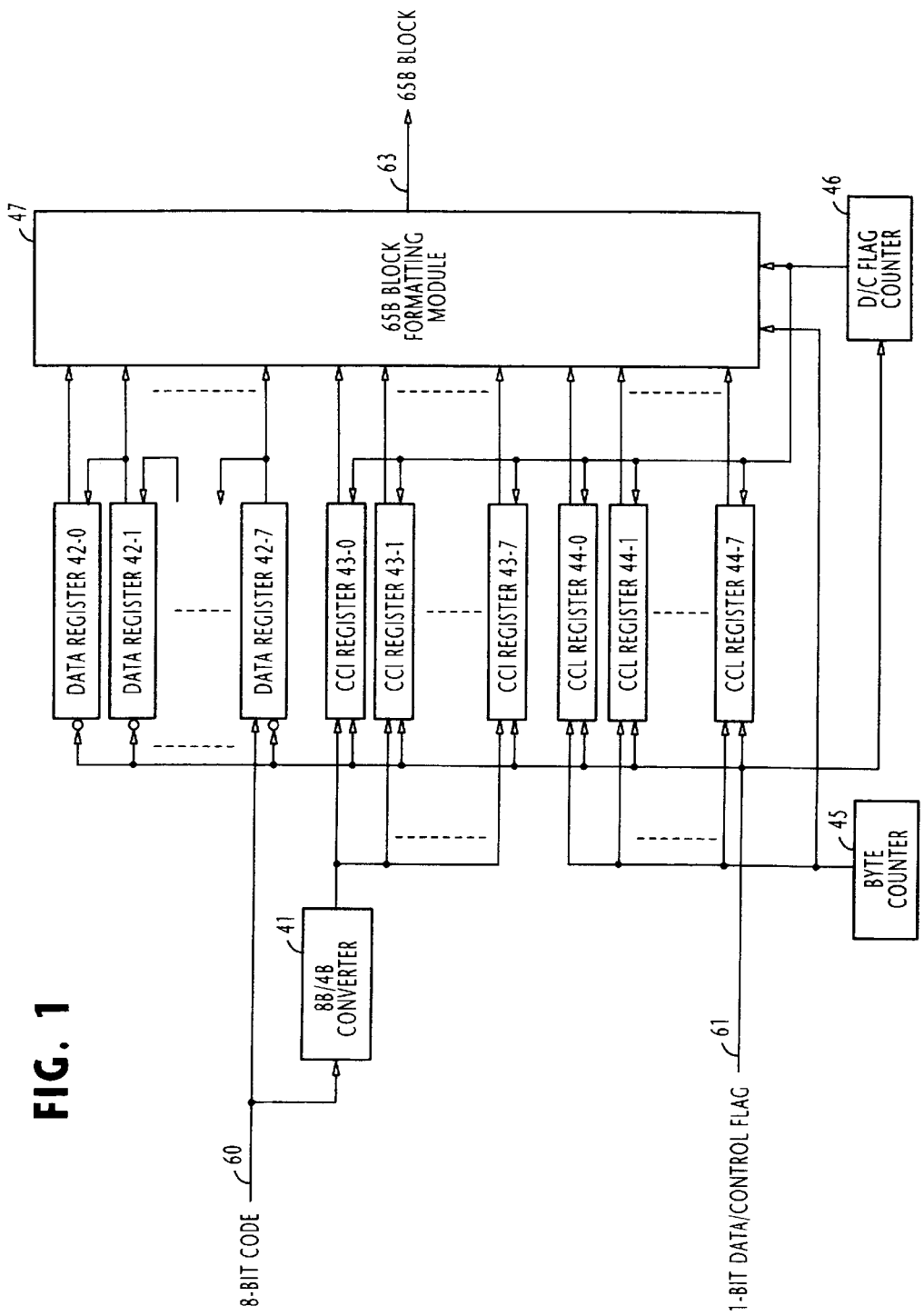
FIG. 1 is a block diagram of a 64B/65B converter of the present invention.

The 64B/65B conversion is a process in which a set of eight decoded 8B/10B codes is organised into a data block of 65 bits, or simply "65B block". The 8B/10B code is a bit-serial 10-bit length code having excellent properties for transmitting information. According to the 8B/10B coding scheme, 256 types of data code and 12 types of control code (or special codes) are defined.

Before proceeding with the detailed description of the present invention, it may prove helpful to provide an explanation of the 64B/65B conversion process employed in the GFP (Generic framing Procedure) draft standard with reference to FIG. 7. As illustrated, a 65B block is composed of one flag bit (P) placed in the first bit position of the block and eight bytes of data and/or control codes placed in the remaining byte positions. When the flag F of a 65B block is 1, it means that it contain at least one control code.

Otherwise, it means that all of its byte positions are occupied with data codes. If a 65B block contains one or more control codes, these control codes are placed in positions preceding those occupied by data codes. When a series of 8B/10B codes of D1, D2, D3, K1, D4, D5, D6 and K2 are stored in memory in that order, they are reordered in the 65B format so that the control codes K1 and K2 are placed in the first and second byte positions and the data codes D1, D2, D3, D4, D5 and D6 are placed in the third to the eighth byte positions, as shown in FIG. 9. Note that byte sequence integrity is maintained for both control and data codes when they are reordered in the 65B format.

Each of the eight bytes of the 65B block in which an 8-bit control code is assigned is segmented into three areas. The first area is a 1-bit LCC (last control character), the second area is a 3-bit CCL (control character locator), and the third area is a 4-bit CCI (control character indicator). The LCC of a byte position, which occupies the first bit position of the byte, assumes a "1" when a control code is stored in the byte position and yet another control code is stored in the next byte position, and assumes a "0" when a control code is stored In the byte position and yet a data code is stored in the next byte position, or when the LCC is in the last byte position of the 65B block. The 3-bit CCL of a byte position, which occupies the second to the fourth bit position of the byte, represents the original byte position of an 8-bit control code which will be set in the byte position of the 65B block. This original byte position is identified by a serial number 0 to 7 in a sequence of eight 8B/10B codes. If the CCL of a given control code is "6", for example, it means that given control code was in the seventh position of the original eight 8B/10B codes. The i-th byte position of the 65B block in which a data code is stored is identified as DV[i] (where i=0, 1, 2, . . . 7) and the LCC, CCL and CCI areas of the i-th byte position are identified respectively by LCC[i], CCL[i] and CCI[i]. For a given number of control bytes contained in a 65B block, the contents of its flag bit F, LCC and CCL are uniquely determined.

The 4-bit CCI of a byte position, which occupies the fifth to the eighth bit position of the byte, is used to store a 4-bit control code which has been converted from a corresponding 8-bit control code. As one example, the format of the 4-bit control code is defined by the GFP draft specification (T1X1.5/2001-158) as shown in FIG. 9, in which 8-bit control codes are mapped to corresponding 4-bit control codes as well as to their meanings.

Referring to FIG. 1, the 64B/65B converter of the present invention is comprised of an 8B/4B control code converter 41, a set of eight data registers 42-N (where N=1, 2, . . . , 8), a set of eight CCI registers 43-N, and a set of eight CCL registers 44-N. A 65B block formatting module 47 is connected to the outputs of all registers 42, 43 and 44.

Figure 8:
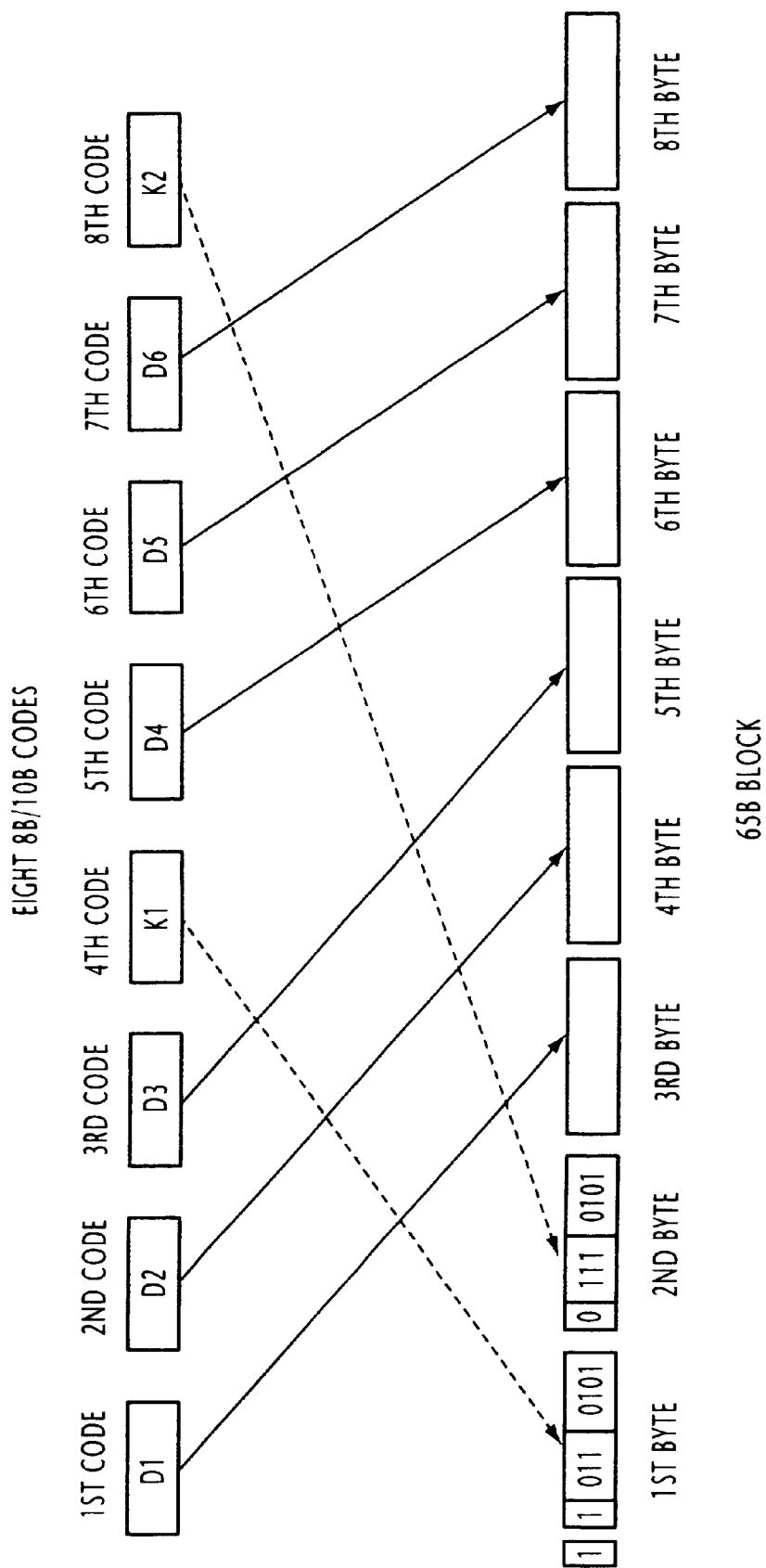
FIG. 8 is an illustration for describing the sequence integrity of data and control codes.

An 8-bit input code is supplied on lead 60 to the 8B/4B control code converter 41 and to the data register 42-7. If the input 8-bit code is a control code, the 8B/4B converter 41 produces a 4-bit control code according to the mapped relationship indicated in FIG. 8. Concurrently with the 8-bit input code, a one-bit D/C (data/control) flag is supplied on lead 61 for enabling the CCI and CCL registers and disabling the data registers when a "1" is set in the D/C flag. Data registers 42-8 to 42-1 are connected to each other so that, when an input 8-bit data code is received and a concurrently received D/C flag is "0", all data registers 42 are enabled and data codes are shifted from registers 42-N to adjacent registers 42-N-1).

Further provided are a code (byte) counter 45 which increments an 8-bit byte count number when an input 8-bit code has been stored in the appropriate registers. This byte count number indicates the position of each input byte in a sequence of random arrivals. A D/C flag counter 46 is connected to the lead 61 to increment an 8-bit control code number when the D/C flag is "1". This control code number, which appears at the output of counter 46, is used to specify one of the CCI registers 42 in which to store a 4-bit control code from code converter 41 and to further specify one of the CCL registers 43 in which to store a byte count number from code counter 45 as a 3-bit control code locator (i.e., order of arrival indication of each control code). Four-bit control codes are sequentially stored in the CCI registers 43 in order of their arrival and order-of-arrival indications of these control codes are stored sequentially in the CCL registers 44.

The control code number, which indicates the count number of received control codes, is further supplied from the D/C flag counter 46 to the 65B block generation module 47. When the byte count number at the output of counter 45 is equal to "7", in which it is used to produce a flag bit F and a last control character (LCC) and select appropriate ones of the outputs of all registers and generates a serial 65-bit block on an output lead 63.

The operation of the 64B/65B converter of FIG. 1 will be fully understood by the following description with reference to a flowchart shown in FIG. 2.

At the start of the routine, the byte counter 45 and the D/C flag counter 46 are initialized to a zero count number at step 100.

When an 8-bit code and a D/C flag bit are received (step 101) and if this flag bit is "1" (step 102), the 8B/4B control code converter 41 produces a 4-bit control code from the input 8-bit code (step 103). The 4-bit control code is set into one of the CCI registers 43, which is specified by the 8-bit output of D/C flag counter 46 (step 104). At step 105, the 8-bit byte count number at the output of byte counter 45 is set into one of the CCL registers 44, which is specified by the output of flag counter 46. D/C flag counter 46 is incremented by one at step 106.

If the flag bit is "0" (step 102) when an 8-bit code is received, data codes DV are shifted from data registers 42-N to adjacent data registers 42-(N-1) and the input 8-bit data code is loaded into the data register 42-8 (step 107).

When the output of byte counter 45 is not equal to "7" (step 108) after the flag counter 46 has been incremented (step 106) or the data register 42-7 is loaded with an 8-bit code (step 107), the byte counter 45 is incremented by one (step 109) and flow returns to step 101 to repeat the process. If the byte counter 45 output is equal to "7", the 65B block generation module 47 is enabled and formulates a 65B block according to the control code number represented by the output of D/C flag counter 46 (see also FIG. 8). Following the generation of a serial 65B block, the 64B/65B converter returns to initialization step 100.

Figure 3A:
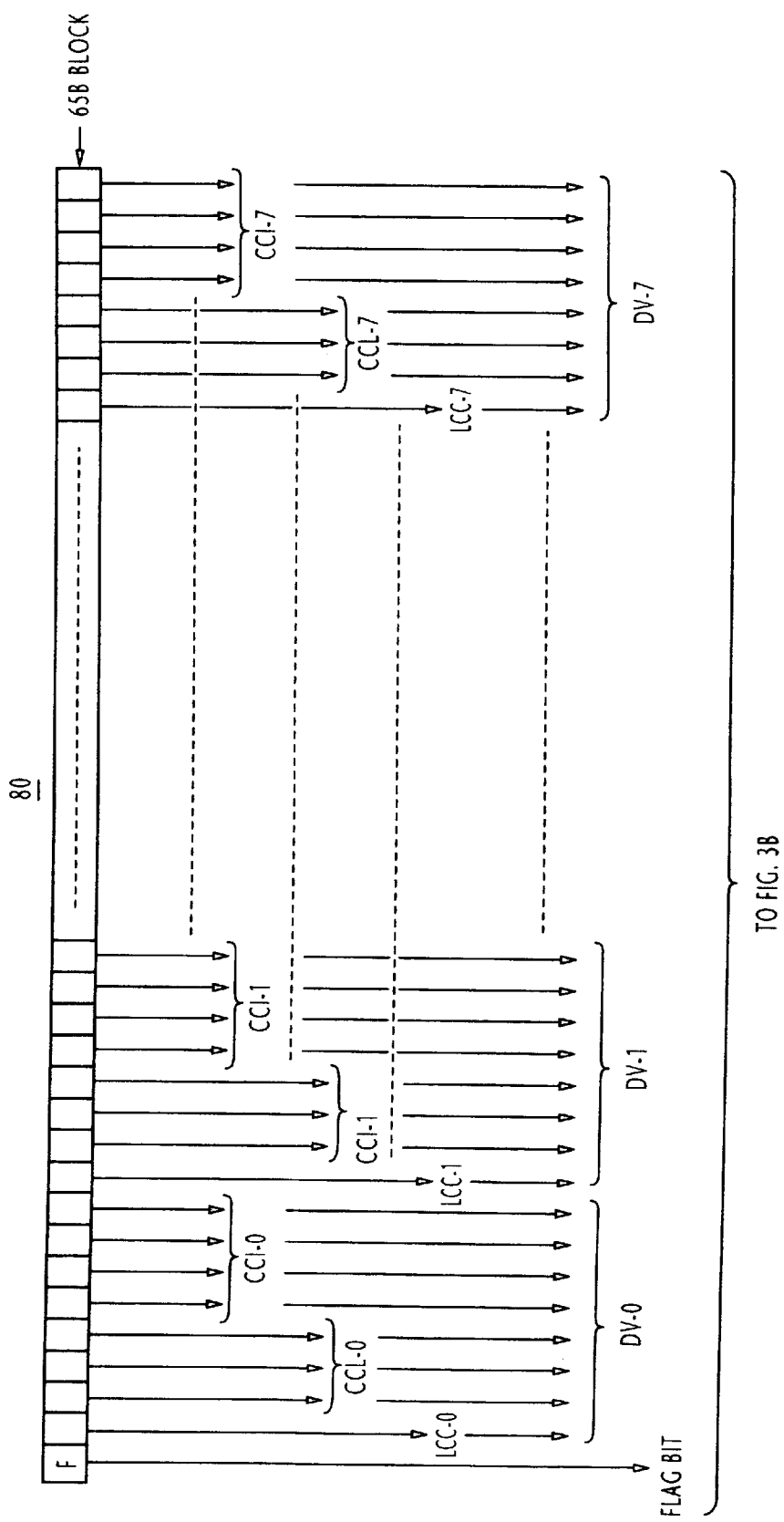
FIGS. 3A and 3B are block diagrams of a 65B/64B converter of the present invention.
Figure 3B:
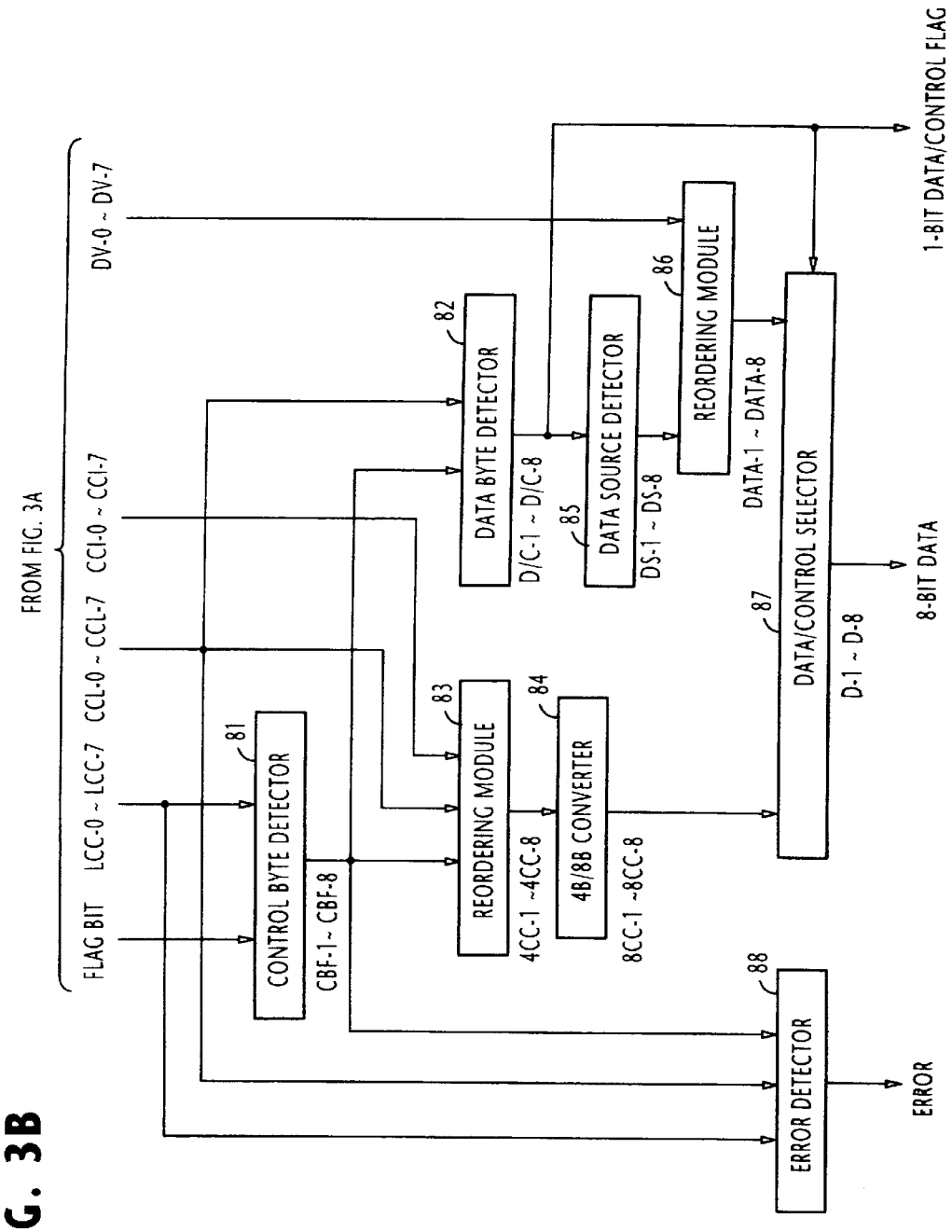

A 65B/64B converter of the present invention is shown in FIGS. 3A and 3B. The 65B/64B converter performs a process inverse to that of the 64B/65B converter of FIG. 1 on a serial 65B block supplied and stored in respective bit positions of a register 80. When all bits of the 65B block are stored in the register 80, they are supplied in parallel fashion to other modules of the 65B/64B converter shown in FIG. 3B.

The 65B/64B converter includes a control byte detector 81 to which parallel data from the flag bit (F) and the LCC-0 to LCC-7 positions of the register 80 are applied. As described in detail later, the control byte detector 81 produces control byte flags CBF-1~CBF-8, which are supplied to a reordering module 83 along with data from the CCL-0~CCL-7 and CCI-0~CCI-7 positions. The CCI data are reordered in proper sequence according to the CCL and CBF data and 4-bit codes 4CC-1~4CC-8 are produced in the reordered sequence.

If the 65B block contains no control code, this sequence of 4-bit codes will be a series of invalid 4-bit control codes and if the 65B block contains no data codes, this sequence will be a series of valid 4-bit control codes. Therefore, if the 65B block is a mixture of control codes and data codes, this sequence will be a mixed series of one or more valid and invalid 4-bit control codes.

The output of reordering module 83 is supplied to a 4B/8B control code converter 84 where the 4-bit control code is mapped to a corresponding one of 8-bit control codes 8CC-1~8CC-8, which are produced at the output of the converter 84 and supplied to a data/control selector 87.

On the other hand, the original data codes are recovered from the 64-bit wide data from the DV-0~DV-7 positions of the 65B block, using the control byte flags CBF-1~CBF-8 and data from the CCL-0~CCL-7 positions.

A data byte detector 82 receives CBF-1~CBF-8 from the control byte detector 81 and CCL data from the register 80 to produce eight 1-bit D/C flags D/C-1~D/C-8 in sequence. A data source (or position) detector 85 is connected to the output of data byte detector 82 to identify the positions of the original data codes in the 65B block format to produce outputs DS-1~DS-8 each indicating the data source position of the corresponding input data/clock flag. The 64-bit wide data is reordered in a reordering module 86 according to the output of data source detector 85, producing a series of 8-bit wide data codes DATA-1~DATA-8. This 8-bit wide data sequence is applied to the data/control selector 87.

If the 65B block contains no control code, this sequence of 8-bit wide data will be a series of valid data codes and if the 65B block contains no data codes, this sequence will be a series of valid control bytes. Therefore, if the 65B block is a mixture of control codes and data codes, this sequence will be a mixed series of one or more valid and invalid 8-bit data codes.

In response to each bit of the D/C flag sequence from the data byte detector 84, the data/control selector 87 selects an 8 bit control code or an 8-bit data code from the outputs of the converter 84 and reordering module 86 and produces a series of eight 8-bit data D-1~D-8.

Figure 4B:
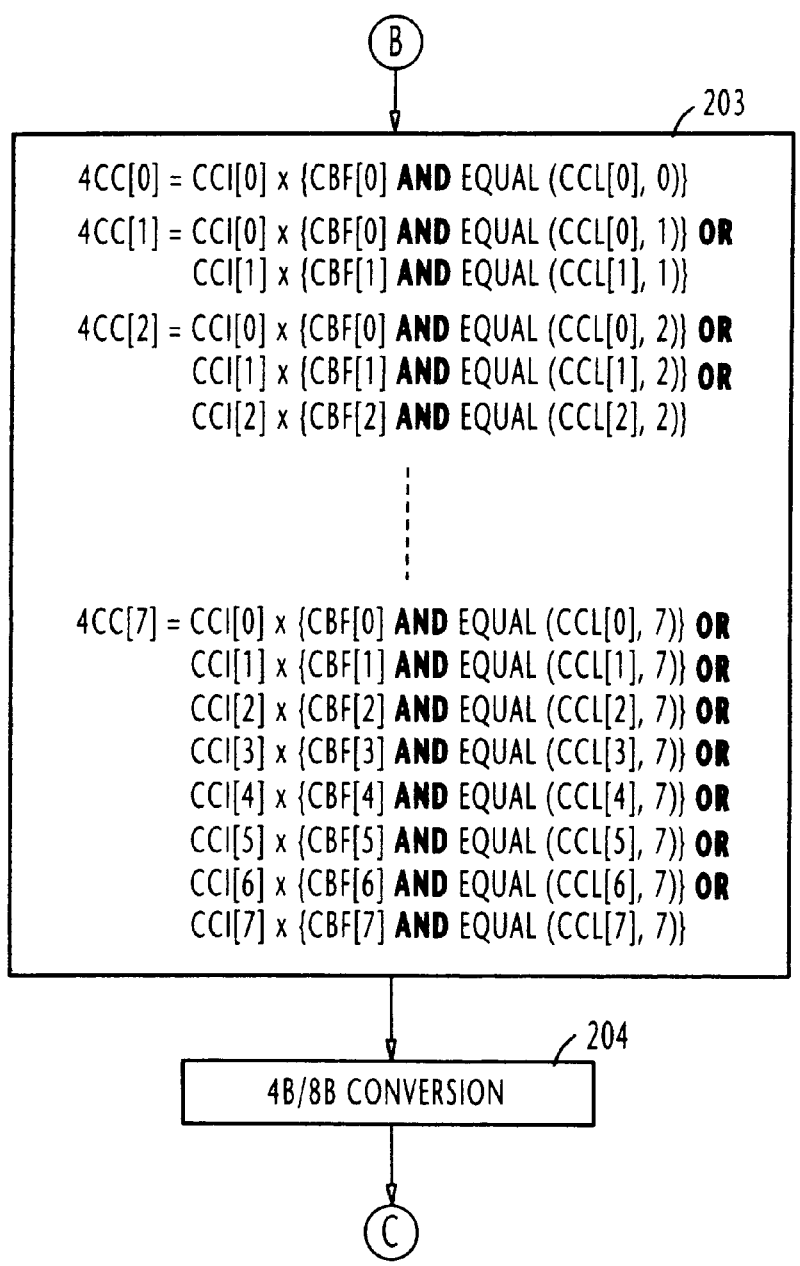
Figure 4C:
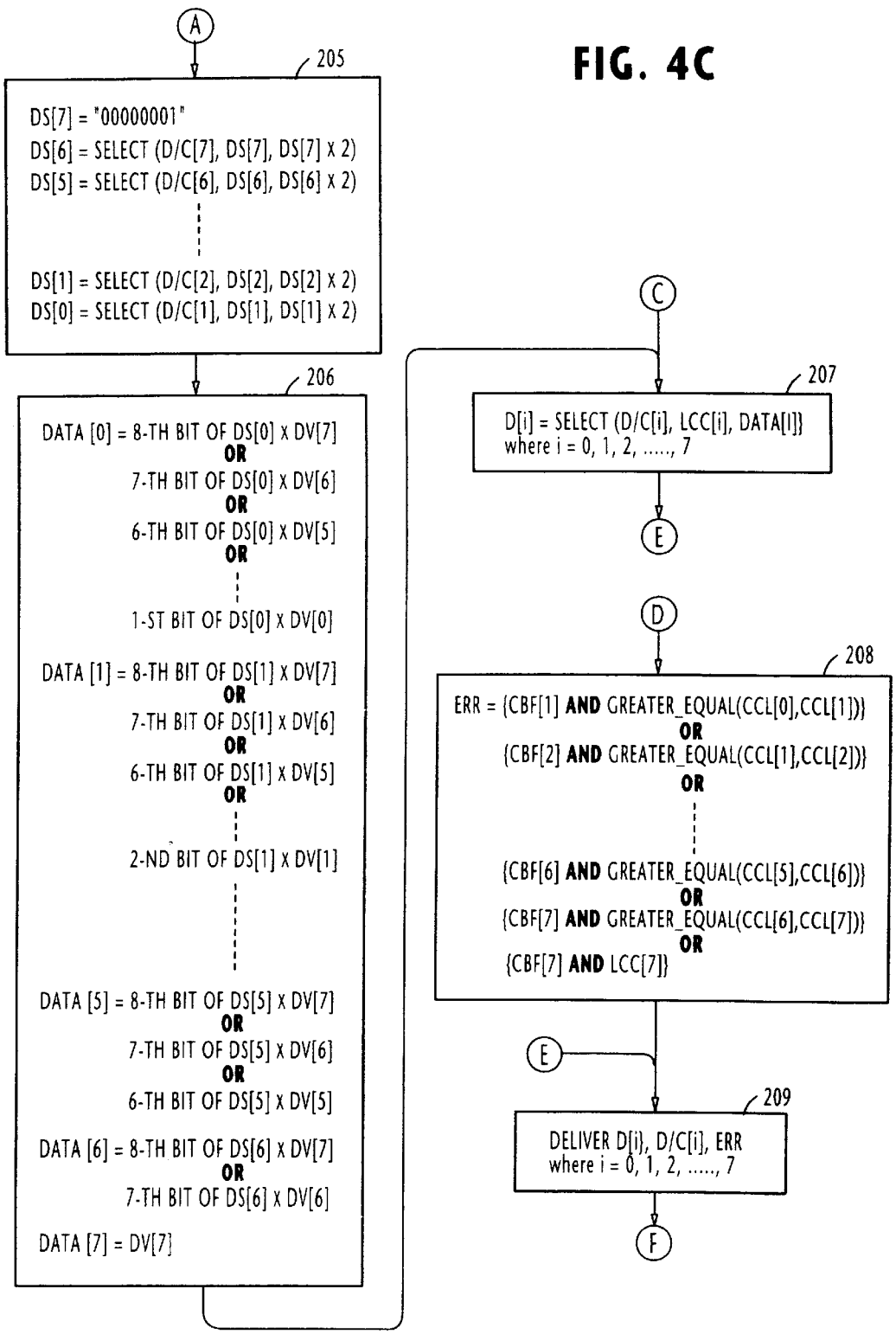

The operation of the 65B/64B converter of FIGS. 3A and 3B will be fully understood by the following description with reference to flowcharts shown in FIGS. 4A, 4B and 4C.

At the start of the routine, the 65B/64B converter receives all bits of a 65B block (step 200).

At step 201, the control byte detector 81 starts processing on the input data to produce a one-bit control byte flag CBF[i], where i=0, 1, 2, . . . , 7. Since the flag F must be equal to 1 if a control code is set in the first byte position of the 65B block, the control byte detector 81 initially sets the first control byte flag CBF[0] equal to F (step 201). Then, the following recursive formula is calculated for i=1, 2, . . . , 7:

CBF[i]=CBF[i−1] "and" LCC[i−1]

where "and" represents logical product.

Since CBF[0]=F, the control byte detector 83 produces the following control byte flags for i=1, 2, . . . , 7:

CBF[1]=F "and" LCC[0]
CBF[2]=F "and" LCC[0] "and" LCC[1]
CBF[3]=F "and" LCC[0] "and" LCC[1] "and" LCC[2]
CBF[4]=F "and" LCC[0] "and" LCC[1] "and" LCC[2] "and" LCC[3]
CBF[5]=F "and" LCC[0] "and" LCC[1] "and" LCC[2] "and" LCC[3]"and" LCC[4]
CBF[6]=F "and" LCC[0] "and" LCC[1] "and" LCC[2] "and" LCC[3]"and" LCC[4] "and" LCC[5]
CBF[7]=F "and" LCC[0] "and" LCC[1] "and" LCC[2] "and" LCC[3]"and" LCC[4]"and" LCC[5] "and" LCC[6]

Therefore, if the 65B block contains no control code, the outputs of the control byte detector 81 are all zero. If only one control code is included in a 65B block, the outputs of control byte detector 81 are CBF[0]=1, and CBF[1]~CBF[7]=0. If two control codes are included, the outputs of control byte detector 81 are CBF[0] and CBF[1]=1, and CBF[2]~CBF[7]=0, and so forth. As a result, if control codes are set in all byte positions of a 65B block, the outputs of the detector 81 are CBF[0] ~CBF[7]=1.

At step 202, the data byte detector 82 operates on CBF-1~CBF-8 data from the control byte detector 81 and data from the CCL-0 to CCL-7 positions of the 65B block to produce a series of eight D/C flag bits (D/C[0]~D/C [7]). In order for a data/control flag bit D/C-N (where, $1 \leq N \leq 8$) to be equal to 1, it is necessary that any one of the location data from the CCL positions is equal to N−1. However, in order for location data CCL to be valid and meaningful, it is necessary that the corresponding control byte flag CBF must be equal to 1. Therefore, in order for a data/control flag D/C-N to become equal to 1, it is necessary that CBF-M (where, M=1, 2, . . . , 8) is 1 and CCL-M assumes a value equal to N−1. The number of variables M which satisfies this requirement is obtained by the following summation:

$$\sum_{0 \leq i \leq 7} \{CBF[i] \text{ "and" EQUAL}(CCL[i], N-1) \quad (1)$$

When Equation (1) is equal to 0, the data/control flag bit D/C[i] is set equal to 0. Otherwise, it is set equal to 1. If there is an error in the 65B block, which will be detected by the error detector 88, the solution of Equation (1) will yield a value equal to "2" or greater. When such an error occurs, the value of the D/C flag is indefinite and ignored. Therefore, the arithmetic sum as given by Equation (1) can be represented by a logical sum and D/C flag[i] is obtained by the following relations.

$$D/C[i] = \{CBF[0] \text{ "and" EQUAL}(CCL[0], i)\} \text{ "or"} \quad (2)$$
$$\{CBF[1] \text{ "and" EQUAL}(CCL[1], i)\} \text{ "or"}$$
$$\{CBF[2] \text{ "and" EQUAL}(CCL[2], i)\} \text{ "or"}$$
$$\{CBF[3] \text{ "and" EQUAL}(CCL[3], i)\} \text{ "or"}$$
$$\{CBF[4] \text{ "and" EQUAL}(CCL[4], i)\} \text{ "or"}$$
$$\{CBF[5] \text{ "and" EQUAL}(CCL[5], i)\} \text{ "or"}$$
$$\{CBF[6] \text{ "and" EQUAL}(CCL[6], i)\} \text{ "or"}$$
$$\{CBF[7] \text{ "and" EQUAL}(CCL[7], i)\}$$

where, $0 \leq i \leq 7$, "or" represents logical sum and EQUAL (a, b) indicates that when the "a" is equal to the "b", EQUAL (a, b) is 1 and when the "a" is not equal the "b", EQUAL (a, b) is 0.

If variables "i" and "j" satisfy the relation $i+1 \leq J \leq 7$, Equation (2) is rewritten as:

$$[CBF[j] \text{ "and" EQUAL } (CCL[j], i]=0 \quad (3)$$

Since sequence integrity is maintained for all control and data codes, the following relations exist:

$$0 \leq CCL[0] < CCL[1] < \ldots < CCL[C-1] \quad (4)$$

where, C is the number of control codes contained in a 65B block. From Equation (4), the following relations yield;

$$CCL[0] \, CCL[1] \geq 1, \ldots, CCL[C-1] \geq C-1 \quad (5)$$

Hence, the following relation is obtained.

$$CCL[i] \geq i \text{ (where, } 0 \leq i < C) \quad (6)$$

Therefore, the relation $CCL[j] \geq i+1$ exists for variable "j" that satisfies the relation $(i+1 \leq j < C)$. Stated differently, the relation EQUAL $(CCL[j], i)=0$ is established for variable "j" which satisfies the relation $(i+1 \leq j < n)$. Since CBF[i]=0 for $C \leq i \leq 7$, Equation (3) is valid if variable "j" satisfies the relation $i+1 \leq j \leq 7$. As a result, Equation (2) can be rewritten as follows:

$$D/C[0] = \{CBF[0] \text{ "and" EQUAL } (CCL[0], 0)\} \quad (7-1)$$

$$\begin{aligned} D/C[1] = &\{CBF[0] \text{ "and" EQUAL}(CCL[0], 1)\} \text{ "or"} \\ &\{CBF[1] \text{ "and" EQUAL}(CCL[1], 1)\} \end{aligned} \quad (7-2)$$

$$\begin{aligned} D/C[2] = &\{CBF[0] \text{ "and" EQUAL}(CCL[0], 2)\} \text{ "or"} \\ &\{CBF[1] \text{ "and" EQUAL}(CCL[1], 2)\} \text{ "or"} \\ &\{CBF[2] \text{ "and" EQUAL}(CCL[2], 2)\} \end{aligned} \quad (7-3)$$

$$\begin{aligned} D/C[3] = &\{CBF[0] \text{ "and" EQUAL}(CCL[0], 3)\} \text{ "or"} \\ &\{CBF[1] \text{ "and" EQUAL}(CCL[1], 3)\} \text{ "or"} \\ &\{CBF[2] \text{ "and" EQUAL}(CCL[2], 3)\} \text{ "or"} \\ &\{CBF[3] \text{ "and" EQUAL}(CCL[3], 3)\} \end{aligned} \quad (7-4)$$

$$\begin{aligned} D/C[4] = &\{CBF[0] \text{ "and" EQUAL}(CCL[0], 4)\} \text{ "or"} \\ &\{CBF[1] \text{ "and" EQUAL}(CCL[1], 4)\} \text{ "or"} \\ &\{CBF[2] \text{ "and" EQUAL}(CCL[2], 4)\} \text{ "or"} \\ &\{CBF[3] \text{ "and" EQUAL}(CCL[3], 4)\} \text{ "or"} \\ &\{CBF[4] \text{ "and" EQUAL}(CCL[4], 4)\} \end{aligned} \quad (7-5)$$

$$\begin{aligned} D/C[5] = &\{CBF[0] \text{ "and" EQUAL}(CCL[0], 5)\} \text{ "or"} \\ &\{CBF[1] \text{ "and" EQUAL}(CCL[1], 5)\} \text{ "or"} \\ &\{CBF[2] \text{ "and" EQUAL}(CCL[2], 5)\} \text{ "or"} \\ &\{CBF[3] \text{ "and" EQUAL}(CCL[3], 5)\} \text{ "or"} \\ &\{CBF[4] \text{ "and" EQUAL}(CCL[4], 5)\} \text{ "or"} \\ &\{CBF[5] \text{ "and" EQUAL}(CCL[5], 5)\} \end{aligned} \quad (7-6)$$

$$\begin{aligned} D/C[6] = &\{CBF[0] \text{ "and" EQUAL}(CCL[0], 6)\} \text{ "or"} \\ &\{CBF[1] \text{ "and" EQUAL}(CCL[1], 6)\} \text{ "or"} \\ &\{CBF[2] \text{ "and" EQUAL}(CCL[2], 6)\} \text{ "or"} \\ &\{CBF[3] \text{ "and" EQUAL}(CCL[3], 6)\} \text{ "or"} \\ &\{CBF[4] \text{ "and" EQUAL}(CCL[4], 6)\} \text{ "or"} \\ &\{CBF[5] \text{ "and" EQUAL}(CCL[5], 6)\} \text{ "or"} \\ &\{CBF[6] \text{ "and" EQUAL}(CCL[6], 6)\} \end{aligned} \quad (7-7)$$

$$\begin{aligned} D/C[7] = &\{CBF[0] \text{ "and" EQUAL}(CCL[0], 7)\} \text{ "or"} \\ &\{CBF[1] \text{ "and" EQUAL}(CCL[1], 7)\} \text{ "or"} \\ &\{CBF[2] \text{ "and" EQUAL}(CCL[2], 7)\} \text{ "or"} \\ &\{CBF[3] \text{ "and" EQUAL}(CCL[3], 7)\} \text{ "or"} \\ &\{CBF[4] \text{ "and" EQUAL}(CCL[4], 7)\} \text{ "or"} \\ &\{CBF[5] \text{ "and" EQUAL}(CCL[5], 7)\} \text{ "or"} \\ &\{CBF[6] \text{ "and" EQUAL}(CCL[6], 7)\} \text{ "or"} \\ &\{CBF[7] \text{ "and" EQUAL}(CCL[7], 7)\} \end{aligned} \quad (7-8)$$

Concurrently with the execution of step 202, step 203 is processed by the reordering module 83, which operates to reorder the series of 4-bit data so that they are arranged in the same order that the decoded 8B/10B control codes are originally received. In order to set a 4-bit data from the CCI[i] position (where, i=0, 1, 2, . . . , 7) in a proper sequence, it is necessary that the control byte flag CBF-M must be equal to 1 and the control code locator CCL-M must be equal to N−1. If there is no variable M that satisfies this requirement, the data/control flag D/C-N produced by the data byte detector 84 must be zero. In that case, the reordered 4CC-N data may take an indefinite value. If there is more than one variable M that satisfies this requirement, it is determined that there is an error in the 65B block, and the reordered 4CC-N data is allowed to take an indefinite value. Thus, there is only one variable M for a valid 4-bit control code. As a result, reordered control codes 4CC[0]~4CC[7] are obtained by solving the following equation:

$$\begin{aligned} 4CC[i] = &CCI[0] \times \{CBF[0] \text{ "and" EQUAL}(CCL[0], i)\} \text{ "or"} \\ &CCI[1] \times \{CBF[1] \text{ "and" EQUAL}(CCL[1], i)\} \text{ "or"} \\ &CCI[2] \times \{CBF[2] \text{ "and" EQUAL}(CCL[2], i)\} \text{ "or"} \\ &CCI[3] \times \{CBF[3] \text{ "and" EQUAL}(CCL[3], i)\} \text{ "or"} \\ &CCI[4] \times \{CBF[4] \text{ "and" EQUAL}(CCL[4], i)\} \text{ "or"} \\ &CCI[5] \times \{CBF[5] \text{ "and" EQUAL}(CCL[5], i)\} \text{ "or"} \\ &CCI[6] \times \{CBF[6] \text{ "and" EQUAL}(CCL[6], i)\} \text{ "or"} \\ &CCI[7] \times \{CBF[7] \text{ "and" EQUAL}(CCL[7], i)\} \end{aligned} \quad (8)$$

where, $0 \leq i \leq 7$.

By using the relation CBF[i] "and" EQUAL (CCL[i], i)=0 for variable "j" that satisfies the relation $i+1 \leq j \leq 7$ in the same manner as described in connection with step 202, Equation (8) can be rewritten as follows:

$$4CC[0] = CCI[0] \times \{CBF[0] \text{ "and" EQUAL } (CCL[0], 0)\} \quad (9-1)$$

$$\begin{aligned} 4CC[1] = &CCI[0] \times \{CBF[0] \text{ "and" EQUAL}(CCL[0], 1)\} \text{ "or"} \\ &CCI[1] \times \{CBF[1] \text{ "and" EQUAL}(CCL[1], 1)\} \end{aligned} \quad (9-2)$$

$$\begin{aligned} 4CC[2] = &CCI[0] \times \{CBF[0] \text{ "and" EQUAL}(CCL[0], 2)\} \text{ "or"} \\ &CCI[1] \times \{CBF[1] \text{ "and" EQUAL}(CCL[1], 2)\} \text{ "or"} \\ &CCI[2] \times \{CBF[2] \text{ "and" EQUAL}(CCL[2], 2)\} \end{aligned} \quad (9-3)$$

$$\begin{aligned} 4CC[3] = &CCI[0] \times \{CBF[0] \text{ "and" EQUAL}(CCL[0], 3)\} \text{ "or"} \\ &CCI[1] \times \{CBF[1] \text{ "and" EQUAL}(CCL[1], 3)\} \text{ "or"} \\ &CCI[2] \times \{CBF[2] \text{ "and" EQUAL}(CCL[2], 3)\} \text{ "or"} \\ &CCI[3] \times \{CBF[3] \text{ "and" EQUAL}(CCL[3], 3)\} \end{aligned} \quad (9-4)$$

$$\begin{aligned} 4CC[4] = &CCI[0] \times \{CBF[0] \text{ "and" EQUAL}(CCL[0], 4)\} \text{ "or"} \\ &CCI[1] \times \{CBF[1] \text{ "and" EQUAL}(CCL[1], 4)\} \text{ "or"} \\ &CCI[2] \times \{CBF[2] \text{ "and" EQUAL}(CCL[2], 4)\} \text{ "or"} \\ &CCI[3] \times \{CBF[3] \text{ "and" EQUAL}(CCL[3], 4)\} \text{ "or"} \\ &CCI[4] \times \{CBF[4] \text{ "and" EQUAL}(CCL[4], 4)\} \end{aligned} \quad (9-5)$$

$$\begin{aligned} 4CC[5] = &CCI[0] \times \{CBF[0] \text{ "and" EQUAL}(CCL[0], 5)\} \text{ "or"} \\ &CCI[1] \times \{CBF[1] \text{ "and" EQUAL}(CCL[1], 5)\} \text{ "or"} \\ &CCI[2] \times \{CBF[2] \text{ "and" EQUAL}(CCL[2], 5)\} \text{ "or"} \\ &CCI[3] \times \{CBF[3] \text{ "and" EQUAL}(CCL[3], 5)\} \text{ "or"} \\ &CCI[4] \times \{CBF[4] \text{ "and" EQUAL}(CCL[4], 5)\} \text{ "or"} \\ &CCI[5] \times \{CBF[5] \text{ "and" EQUAL}(CCL[5], 5)\} \end{aligned} \quad (9-6)$$

-continued $$4CC[6] = CCI[0] \times \{CBF[0] \text{ "and" EQUAL}(CCL[0], 6)\} \text{ "or"} \qquad (9\text{-}7)$$
$$CCI[1] \times \{CBF[1] \text{ "and" EQUAL}(CCL[1], 6)\} \text{ "or"}$$
$$CCI[2] \times \{CBF[2] \text{ "and" EQUAL}(CCL[2], 6)\} \text{ "or"}$$
$$CCI[3] \times \{CBF[3] \text{ "and" EQUAL}(CCL[3], 6)\} \text{ "or"}$$
$$CCI[4] \times \{CBF[4] \text{ "and" EQUAL}(CCL[4], 6)\} \text{ "or"}$$
$$CCI[5] \times \{CBF[5] \text{ "and" EQUAL}(CCL[5], 6)\} \text{ "or"}$$
$$CCI[6] \times \{CBF[6] \text{ "and" EQUAL}(CCL[6], 6)\}$$

$$4CC[7] = CCI[0] \times \{CBF[0] \text{ "and" EQUAL}(CCL[0], 7)\} \text{ "or"} \qquad (9\text{-}8)$$
$$CCI[1] \times \{CBF[1] \text{ "and" EQUAL}(CCL[1], 7)\} \text{ "or"}$$
$$CCI[2] \times \{CBF[2] \text{ "and" EQUAL}(CCL[2], 7)\} \text{ "or"}$$
$$CCI[3] \times \{CBF[3] \text{ "and" EQUAL}(CCL[3], 7)\} \text{ "or"}$$
$$CCI[4] \times \{CBF[4] \text{ "and" EQUAL}(CCL[4], 7)\} \text{ "or"}$$
$$CCI[5] \times \{CBF[5] \text{ "and" EQUAL}(CCL[5], 7)\} \text{ "or"}$$
$$CCI[6] \times \{CBF[6] \text{ "and" EQUAL}(CCL[6], 7)\} \text{ "or"}$$
$$CCI[7] \times \{CBF[7] \text{ "and" EQUAL}(CCL[7], 7)\}$$

The reordered 4-bit control codes are converted by the 4B/8B converter 84 at step 204 according to the conversion table of FIG. 9, producing a sequence of 8-bit control codes 8CC-1~8CC-8.

Figure 5:
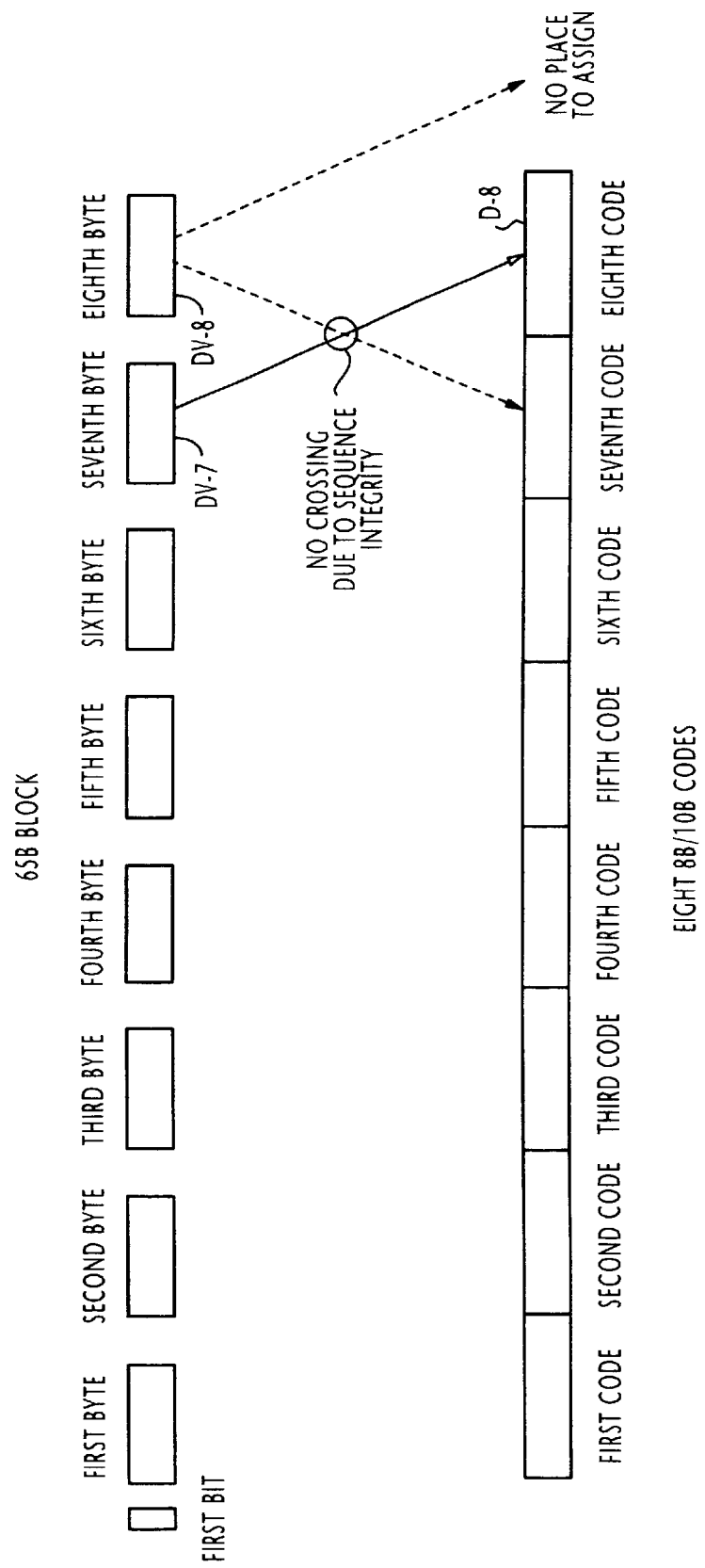
FIG. 5 is an illustration for describing the constraints of the data source detector when determining data sources.

Step 202 is followed by step 205 (FIG. 4B) in which the data source detector 85 operates to produce signals DS-1~DS-8 for indicating the positions of data codes in the 65B block, using the data/control flags D/C-1~D/C-8 from the data byte detector 82. There is a constraint on determining corresponding relationships between the 8-bit output codes D-1~D-8 at the output of the data selector 87 and data codes DATA-1~DATA-8 at the output of the reordering module 86. Consider a case in which the data code DATA-7 corresponds to the 8-bit output data D-8 as shown in FIG. 5. Because of the sequence integrity of the data codes, the data code DATA-8 has no corresponding data at the output of selector 87, and hence no corresponding relationship exists between output data D-8 and data code DATA-7. In general terms, the constraint is that output data D-N (where $2 \leq N \leq 8$) must not correspond to data code DATA-M (where $1 \leq M \leq N$). Therefore, the output data D-8 corresponds exclusively to the data code DATA-8.

As a result, a binary number "00000001" is always set in the data source DS-8, as shown in FIG. 7. If the data/control flag D/C-8 is 1 (i.e., when the eighth 8B/10B code is a control code), the data source DS-8 is meaningless and hence it has no influence on the output of the 65B/64B converter. Therefore, data source DS-8 is rendered invalid when data/control flag bit D/C-8 is 1.

According to the constraint discussed above, the output data D-7 corresponds to the data code DATA-7 or DATA-8, and hence the data source DS-7 assumes a binary number "00000001" or "00000010", depending on the value of data/control flag D/C-8. If D/C-8=0, the data source DS-8 is valid, but its binary number "00000001" cannot be re-used for the data source DS-7. Hence, the data source DS-7 assumes a binary number "00000010" which is equal to a one-bit shifted version of the binary number of the data source DS-8. If D/C-8=1, the data source DS-8 is invalid, the data source DS-7 assumes the same binary number "00000001" as the data source DS-8.

From the foregoing discussion, the following equations are obtained for determining data sources:

$$DS[7] = \text{"00000001"} \qquad (10\text{-}1)$$
$$DS[6] = SELECT(D/C[7], DS[7], DS[7] \times 2) \qquad (10\text{-}2)$$
$$DS[5] = SELECT(D/C[6], DS[6], DS[6] \times 2) \qquad (10\text{-}3)$$
$$DS[4] = SELECT(D/C[5], DS[5], DS[5] \times 2) \qquad (10\text{-}4)$$
$$DS[3] = SELECT(D/C[4], DS[4], DS[4] \times 2) \qquad (10\text{-}5)$$
$$DS[2] = SELECT(D/C[3], DS[3], DS[3] \times 2) \qquad (10\text{-}6)$$
$$DS[1] = SELECT(D/C[2], DS[2], DS[2] \times 2) \qquad (10\text{-}7)$$
$$DS[0] = SELECT(D/C[1], DS[1], DS[1] \times 2) \qquad (10\text{-}8)$$

where, SELECT(c, a, b) indicates that when "c" is 1, "a" is selected and when "c" is 0, "b" is selected.

Figure 6:
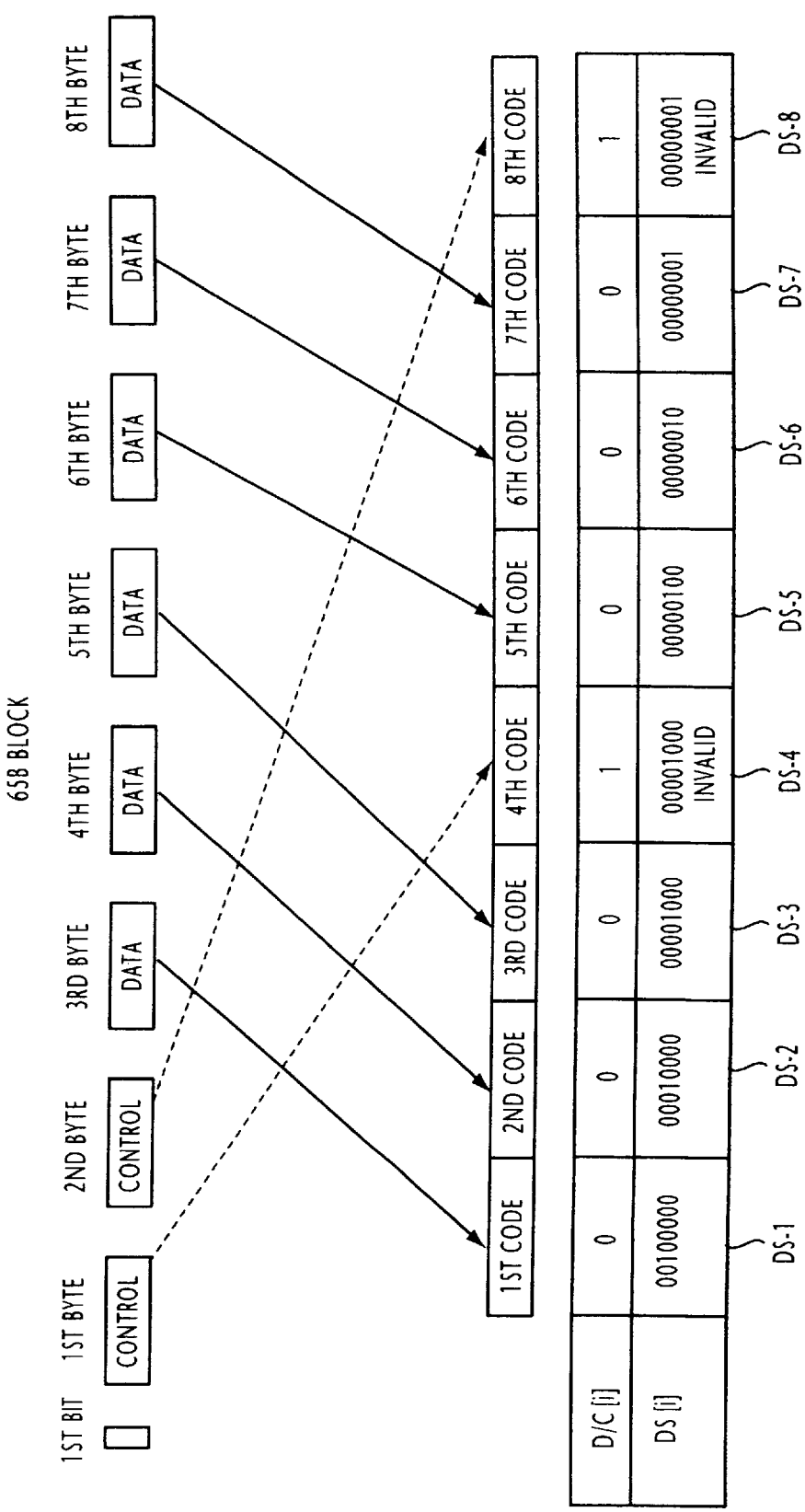
FIG. 6 is an illustration for describing the operation of the data source detector.

FIG. 6 illustrates the data sources DS-1~DS-8 that correspond to the 65B block of FIG. 7. As illustrated, the data sources DS-[3]="00001000" and DS[7]="00000001", where the corresponding flags D/C[3] and D/C[7] are 1, are indicated as being invalid, and other data sources are indicated as being valid. More specifically, the seventh code D10.2 is indicated as the eighth byte of the 65B block, the sixth code D10.2 is indicated as the seventh byte, and so forth.

At step 206, the reordering module 86 provides the reordering of data codes DV-0~DV-7 from the register 80 using the data source values DS-1~DS-8 from the data source detector 85 to produce a reordered sequence of data codes DATA-1~DATA-8. Data codes DATA-N ($1 \leq N \geq 8$) are obtained from the definition of data sources DS-1~DS-8 according to the following equation:

$$DATA[N-1] = \{(1\text{-ST BIT OF } DS[N-1] \times DV[0]\} \text{ "or"} \qquad (11)$$
$$\{(2\text{-ND BIT OF } DS[N-1] \times DV[1]\} \text{ "or"}$$
$$\{(3\text{-TH BIT OF } DS[N-1] \times DV[2]\} \text{ "or"}$$
$$\{(4\text{-TH BIT OF } DS[N-1] \times DV[3]\} \text{ "or"}$$
$$\{(5\text{-TH BIT OF } DS[N-1] \times DV[4]\} \text{ "or"}$$
$$\{(6\text{-TH BIT OF } DS[N-1] \times DV[5]\} \text{ "or"}$$
$$\{(7\text{-TH BIT OF } DS[N-1] \times DV[6]\} \text{ "or"}$$
$$\{(8\text{-TH BIT OF } DS[N-1] \times DV[7]\}$$

As described in connection with step 205, the following constraints exist on the values which can be taken by the data sources DS-2~DS-8:

Data source DS[7] is always equal to "00000001";

The first to the sixth bit of data source DS[6] are always 0;

The first to the fifth bit of data source DS[5] are always 0;

The first to the fourth bit of data source DS[4] are always 0;

The first to the third bit of data source DS[3] are always 0;

The first and the second bits of data source DS[2] are always 0; and

The first bit of data source DS[1] is always 0.

Based on these constraints, Equation (11) is rewritten as follows:

$$DATA[0] = \text{8-TH BIT OF } DS[0] \times DV[7] \text{ "or"} \quad (12\text{-}1)$$
$$\text{7-TH BIT OF } DS[0] \times DV[6] \text{ "or"}$$
$$\text{6-TH BIT OF } DS[0] \times DV[5] \text{ "or"}$$
$$\text{5-TH BIT OF } DS[0] \times DV[4] \text{ "or"}$$
$$\text{4-TH BIT OF } DS[0] \times DV[3] \text{ "or"}$$
$$\text{3-RD BIT OF } DS[0] \times DV[2] \text{ "or"}$$
$$\text{2-ND BIT OF } DS[0] \times DV[1] \text{ "or"}$$
$$\text{1-ST BIT OF } DS[0] \times DV[0]$$

$$DATA[1] = \text{8-TH BIT OF } DS[1] \times DV[7] \text{ "or"} \quad (12\text{-}2)$$
$$\text{7-TH BIT OF } DS[1] \times DV[6] \text{ "or"}$$
$$\text{6-TH BIT OF } DS[1] \times DV[5] \text{ "or"}$$
$$\text{5-TH BIT OF } DS[1] \times DV[4] \text{ "or"}$$
$$\text{4-TH BIT OF } DS[1] \times DV[3] \text{ "or"}$$
$$\text{3-RD BIT OF } DS[1] \times DV[2] \text{ "or"}$$
$$\text{2-ND BIT OF } DS[1] \times DV[1]$$

$$DATA[2] = \text{8-TH BIT OF } DS[2] \times DV[7] \text{ "or"} \quad (12\text{-}3)$$
$$\text{7-TH BIT OF } DS[2] \times DV[6] \text{ "or"}$$
$$\text{6-TH BIT OF } DS[2] \times DV[5] \text{ "or"}$$
$$\text{5-TH BIT OF } DS[2] \times DV[4] \text{ "or"}$$
$$\text{4-TH BIT OF } DS[2] \times DV[3] \text{ "or"}$$
$$\text{3-RD BIT OF } DS[2] \times DV[2]$$

$$DATA[3] = \text{8-TH BIT OF } DS[3] \times DV[7] \text{ "or"} \quad (12\text{-}4)$$
$$\text{7-TH BIT OF } DS[3] \times DV[6] \text{ "or"}$$
$$\text{6-TH BIT OF } DS[3] \times DV[5] \text{ "or"}$$
$$\text{5-TH BIT OF } DS[3] \times DV[4] \text{ "or"}$$
$$\text{4-TH BIT OF } DS[3] \times DV[3]$$

$$DATA[4] = \text{8-TH BIT OF } DS[4] \times DV[7] \text{ "or"} \quad (12\text{-}5)$$
$$\text{7-TH BIT OF } DS[4] \times DV[6] \text{ "or"}$$
$$\text{6-TH BIT OF } DS[4] \times DV[5] \text{ "or"}$$
$$\text{5-TH BIT OF } DS[4] \times DV[4]$$

$$DATA[5] = \text{8-TH BIT OF } DS[5] \times DV[7] \text{ "or"} \quad (12\text{-}6)$$
$$\text{7-TH BIT OF } DS[5] \times DV[6] \text{ "or"}$$
$$\text{6-TH BIT OF } DS[5] \times DV[5]$$

$$DATA[6] = \text{8-TH BIT OF } DS[6] \times DV[7] \text{ "or"} \quad (12\text{-}7)$$
$$\text{7-TH BIT OF } DS[6] \times DV[6]$$

$$DATA[7] = DV[7] \quad (12\text{-}8)$$

Step 207 is executed following steps 202 and 204 have been processed. At step 207, the data/control selector 87 responds to flag D/C-N=0 for selecting an 8-bit data code DATA-N and responds to flag D/C-N=1 for selecting an 8-bit control code 8CC-N.

At step 208, the error detector 88 operates on its input data to produce a signal for indicating the presence or absence of an error in the 65B block. Because of the sequence integrity of the 65B block, the following relations hold:

If control byte flag CBF[1]=1, CCL[0]<CCL[1];
if control byte flag CBF[2]=1, CCL[1]<CCL[2];
if control byte flag CBF[3]=1, CCL[2]<CCL[3];
if control byte flag CBF[4]=1, CCL[3]<CCL[4];
if control byte flag CBF[5]=1, CCL[4]<CCL[5];
if control byte flag CBF[6]=1, CCL[5]<CCL[6]; and
if control byte flag CBF[7]=1, CCL[6]<CCL[7].

When the eighth byte of a 65B block is a control code, data in the LCC-2 position of the block is consistently 0. Thus, the following relation holds:

If CBF[7]=1, then LCC[7]=0

From the above relations, the error detector 88 finds an error in a 65B data block if any one of the relations is not established. More specifically, the above relations can be expressed by the following error detection equation.

$$ERR = \{CBF[1] \text{ "and" } GREATER\_EQUAL(CCL[0], CCL[1])\} \text{ "or"} \quad (13)$$
$$\{CBF[2] \text{ "and" } GREATER\_EQUAL(CCL[1], CCL[2])\} \text{ "or"}$$
$$\{CBF[3] \text{ "and" } GREATER\_EQUAL(CCL[2], CCL[3])\} \text{ "or"}$$
$$\{CBF[4] \text{ "and" } GREATER\_EQUAL(CCL[2], CCL[3])\} \text{ "or"}$$
$$\{CBF[5] \text{ "and" } GREATER\_EQUAL(CCL[2], CCL[3])\} \text{ "or"}$$
$$\{CBF[6] \text{ "and" } GREATER\_EQUAL(CCL[5], CCL[6])\} \text{ "or"}$$
$$\{CBF[7] \text{ "and" } GREATER\_EQUAL(CCL[6], CCL[7])\} \text{ "or"}$$
$$\{CBF[7] \text{ "and" } LCC[7]\}$$

where, GREATER_EQUAL (a, b) indicates that if a≧b GREATER_EQUAL (a, b) equals 1, otherwise 0. An error is detected in the 65B data block if ERR equals 1.

At step 209, output data D-1~D-8 and D/C-1~D/C-8 are delivered from the data selector 87 and date byte detector 82, and if an error is detected an error indication ERR will be delivered from the error detector 88. Then, IS the 65B/64B converter returns to step 200 to repeat the same process on a subsequent 65B data block.

What is claimed is:

1. A code converter for receiving a sequence of randomly arriving input codes of first and second types, comprising:
   storage circuitry for storing said input codes of the first type in first sequential positions in order of arrival, storing said input codes of the second type in second sequential positions in order of arrival, and storing order-of-arrival indications of said input codes in third sequential positions; and
   control circuitry connected to said storage circuitry for organizing contents of said first, second and third sequential positions into a predetermined format according to a signal indicating whether said input code is of said first type or said second type, said organized format containing an identification code indicating whether or not the organized format is a mixture of said first and second types of input codes.

2. A code converter for receiving a sequence of randomly arriving input codes of first and second types, comprising:
   a first counter for producing a first count value indicating a count number of input codes of said first type;
   a second counter for sequentially producing a second count value indicating an order of arrival of each of said input codes in said sequence of random arrival;
   storage circuitry for storing said input codes of the first type in first sequential positions in order of arrival, storing said input codes of the second type in second sequential positions in order of arrival, and storing second count values from said second counter in third sequential positions; and formatting circuitry connected to said storage circuitry for organizing contents of said first, second and third sequential positions into a predetermined format according to said first count value when said second count value attains a predetermined value, said organized format containing an identification code indicating whether or not the organized format is a mixture of said first and second types of input codes.

3. The code converter of claim 2, wherein said formatting circuitry uses said first count value to produce data and appends the data to said format.

4. The code converter of claim 1 or 2, wherein said storage circuitry comprises:

a first group of sequentially operable registers for storing said input code of the first type;

a second group of sequentially operable registers for storing said input code of the second type in sequence; and a third group of sequentially operable registers for storing said code count value of said code counter.

5. The code converter of claim 1 or 2, further comprising converter circuitry for reducing length of the randomly arriving input codes of said first type before the input codes of the first type are stored in said first sequential positions of said storage circuitry.

6. The code converter of claim 2, wherein said first counter receives a first identification code indicating whether each of said input codes is of said first type or said second type and increments said first count value when said each input code is of said first type.

7. The code converter of claim 1 or 2, wherein the input code of said first type is a control code and the input code of said second type is a data code.

8. An inverse code converter for receiving a sequence of input codes of first and second types, the input codes of said first type being consecutively arranged in said sequence and the input codes of said second type being consecutively arranged in said sequence, said sequence containing an identification code indicating whether or not said sequence is a mixture of said first and second types of input codes and position indications of said input codes of said first type in said sequence, comprising:

first detector circuitry for detecting said input codes of the first type according to said identification code and producing a count number of said input codes of the first type;

first reordering circuitry for reordering said input codes of the first type according to said position indications and said count number;

second detector circuitry for producing a type-indication signal indicating whether each of the input codes is of said first type or said second type based on said position indications and said count number;

position detector circuitry for determining the position of each input code of the second type in an output sequence according to said type-indication signal;

second reordering circuitry for reordering each of the input codes of said second type according to the position determined by the position detector circuitry; and selector circuitry for selecting one of the reordered input code of the first type and the reordered input code of the second type according to said type-indication signal.

9. The inverse code converter of claim 8, further comprising converter circuitry for increasing length of the reordered input code of the first type before the reordered input code of the first type is selected by said selector circuitry.

10. The inverse code converter of claim 8 or 9, wherein the input code of said first type is a control code and the input code of said second type is a data code.

11. The inverse code converter of claim 8, further comprising error detection circuitry for detecting an error in the received sequence of said input codes based on said position indications and said count number produced by said first detector circuitry.

12. A method of converting an input sequence of randomly arriving input codes of first and second types into an output sequence of sequentially arranged output codes of said first or second type or a mixture thereof, comprising the steps of:

incrementing a first count value indicating a count number of input codes of said first type in response to each said input code of the first type;

incrementing a second count value indicating an order of arrival of each of said input codes in said input sequence in response to each said input code of either of said first and second types;

storing said input codes of the first type in first sequential storage positions in order of arrival, storing said input codes of the second type in second sequential storage positions in order of arrival, and storing second count values from said second counter in third sequential storage positions; and organizing contents of said first, second and third sequential storage positions into said output sequence according to said first count value when said second count value attains a predetermined value, said output sequence containing an identification code indicating whether or not the output sequence contains a mixture of said first and second types of input codes.

13. The method of claim 12, wherein the step of organizing comprises the step of producing data from said first count value and appending the data to the organized format.

14. The method of claim 12, further comprising the step of reducing length of the randomly arriving input codes of said first type before the input codes of the first type are stored in said first sequential storage positions.

15. The method of claim 14, wherein the input code of said first type is a control code and the input code of said second type is a data code.

16. A method of converting a received sequence of input codes of first and second types into an output sequence, the input codes of said first type being consecutively arranged in said received sequence and the input codes of said second type being consecutively arranged in said received sequence, said received sequence containing an identification code indicating whether or not said received sequence is a mixture of said first and second types of input codes and position indications of said input codes of said first type in said sequence, comprising the steps of:

detecting said input codes of the first type according to said identification code and producing a count number of said input codes of the first type;

reordering said input codes of the first type according to said position indications and said count number and producing a type-indication signal indicating whether each of the input codes is of said first type or said second type based on said position indications and said count number;

determining the position of each input code of the second type in an output sequence according to said type-indication signal;

reordering each of the input codes of said second type according to the position determined by the position detector circuitry; and selecting one of the reordered input code of the first type and the reordered input code of the second type according to said type-indication signal.

17. The method of claim 16, further comprising the step of increasing length of the reordered input code of the first type before the reordered input code of the first type is selected.

18. The method of claim 16 or 17, wherein the input code of said first type is a control code and the input code of said second type is a data code.

19. The method of claim 16, further comprising the step of detecting an error in the received sequence of said input codes based on said position indications and said count number.

20. A computer readable storage medium containing a program for converting an input sequence of randomly arriving input codes of first and second types into an output sequence of sequentially arranged output codes of said first or second type or a mixture thereof, said program comprising the steps of:

incrementing a first count value indicating a count number of input codes of said first type in response to each said input code of the first type;

incrementing a second count value indicating an order of arrival of each of said input codes in said input sequence in response to each said input code of either of said first and second types;

storing said input codes of the first type in first sequential storage positions in order of arrival, storing said input codes of the second type in second sequential storage positions in order of arrival, and storing second count values from said second counter in third sequential storage positions; and organizing contents of said first, second and third sequential storage positions into said output sequence according to said first count value when said second count value attains a predetermined value, said output sequence containing an identification code indicating whether or not the output sequence contains a mixture of said first and second types of input codes.

21. The computer readable storage medium of claim 20, further comprising the step of reducing length of the randomly arriving input codes of said first type before the input codes of the first type are stored in said first sequential storage positions.

22. The computer readable storage medium 20 or 21, wherein the input code of said first type is a control code and the input code of said second type is a data code.

23. A computer readable storage medium containing a program of converting a received sequence of input codes of first and second types into an output sequence, the input codes of said first type being consecutively arranged in said received sequence and the input codes of said second type being consecutively arranged in said received sequence, said received sequence containing an identification code indicating whether or not said received sequence is a mixture of said first and second types of input codes and position indications of said input codes of said first type in said sequence, said program comprising the steps of:

detecting said input codes of the first type according to said identification code and producing a count number of said input codes of the first type;

reordering said input codes of the first type according to said position indications and said count number and producing a type-indication signal indicating whether each of the input codes is of said first type or said second type based on said position indications and said count number;

determining the position of each input code of the second type in an output sequence according to said type-indication signal;

reordering each of the input codes of said second type according to the position determined by the position detector circuitry; and selecting one of the reordered input code of the first type and the reordered input code of the second type according to said type-indication signal.

24. The computer readable storage medium of claim 23, further comprising the step of increasing length of the reordered input code of the first type before the reordered input code of the first type is selected.

25. The computer readable storage medium of claim 23 or 24, wherein the input code of said first type is a control code and the input code of said second type is a data code.

26. The computer readable storage medium of claim 23, further comprising the step of detecting an error in the received sequence of said input codes based on said position indications and said count number.

* * * * *